(12) United States Patent
Chen et al.

(10) Patent No.: US 8,252,627 B2
(45) Date of Patent: Aug. 28, 2012

(54) MANUFACTURING METHOD FOR ORGANIC OPTOELECTRONIC THIN FILM

(75) Inventors: Fang-Chung Chen, Nantou County (TW); Ming-Kai Chuang, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/102,286

(22) Filed: May 6, 2011

(65) Prior Publication Data

US 2012/0115266 A1    May 10, 2012

(30) Foreign Application Priority Data

Nov. 4, 2010    (TW) ................ 99138026 A

(51) Int. Cl.
*H01L 51/40* (2006.01)
(52) U.S. Cl. ................ 438/99; 257/E51.012
(58) Field of Classification Search .......... 438/99, 438/62; 257/E51.005, E51.012, E51.018
See application file for complete search history.

(56) References Cited

U.S. PATENT DOCUMENTS 7,879,634 B2 *   2/2011   Kaneko et al. ............... 438/30

FOREIGN PATENT DOCUMENTS

TW    I318334    12/2009

\* cited by examiner

*Primary Examiner* — Lex Malsawma
(74) *Attorney, Agent, or Firm* — Muncy, Geissler, Olds & Lowe, PLLC

(57) ABSTRACT

Disclosed is a manufacturing method for an organic optoelectronic thin film comprising the steps of providing a substrate and a first electrode; forming a semiconductor layer on the substrate, wherein the semiconductor layer includes polyethylene glycol (PEG); forming a conductive polymer layer on the first electrode; disposing the substrate and the semiconductor layer on the conductive polymer layer and adhering the semiconductor layer to the conductive polymer layer; and removing the substrate; and forming a second electrode on the semiconductor layer. A first adhesion between the semiconductor layer and the substrate is generated. A second adhesion between the semiconductor layer and the conductive polymer layer is generated. The second adhesion is greater than the first adhesion so that while the substrate is removed, the semiconductor layer and the conductive polymer layer are still adhered.

8 Claims, 12 Drawing Sheets

| Substrate 21 | Semiconductor layer 22 | Electrically conductive polymer 24 | First electrode 23 |

FIG. 2D

MANUFACTURING METHOD FOR ORGANIC OPTOELECTRONIC THIN FILM

BACKGROUND OF THE INVENTION

1. Field of the Invention

The present invention relates to a manufacturing method for an organic optoelectronic thin film, and more particularly to a manufacturing method for an organic optoelectronic thin film that adds a polymer oxide to a semiconductor layer, and transfers the semiconductor layer to a conductive polymer layer.

2. Description of the Related Art

In the past, organic solar cells were generally manufactured by a solution manufacturing process. In the solution manufacturing process, a layer of solvent is coated onto a substrate first, and then the solvent is coated with poly(3-hexylthiophene) (P3HT) and phenyl C61-butyric acid methyl ester (PCBM). In the manufacturing process, the solvent will dissolve with P3HT and PCBM to cause various problems.

To overcome the aforementioned problem of dissolving solvents during the solution manufacturing process, R.O.C. Pat. No. I318334 by Kumar, A. and Whitesides, G. M. et al. as well as M. L. Chabinyc, et al. disclosed a micro-contact printing technology in 2004, and such technology is illustrated in FIGS. 1A~1D.

In FIGS. 1A~1D, the procedure of the micro-contact printing technology are demonstrated. In FIG. 1A, a silicon substrate 11, whose surface is plated with a gold thin film 12 is shown. In FIG. 1B, a design pattern etched onto a surface is provided, and a layer of ink molecules 14 such as alkanethiol is formed on a poly(dimethylsiloxane) (PDMS) print mold 13. The alkanethiol solution is poured onto the print mold 13 to ink the PDMS print mold 13. In FIG. 1C, the gold plated silicon substrate 11 is in contact with the inked PDMS print mold 13, the ink molecules 14 of alkanethiol on the print mold 13 are combined with gold atoms on the substrate 11 through the covalent bonding to form a self assembled monolayer. In FIG. 1D, after the PDMS print mold is removed, a layer with the design pattern is printed onto the gold plated silicon substrate 11 by the self assembled monolayer 15 with the covalent bonding of alkanethiol.

In the aforementioned manufacturing process of the PDMS print mold, the manufacturing process of the PDMS print mold is too complicated and time consuming. In addition, when the PDMS print mold is processed appropriately during the use of the PDMS is used, the number of times of using the PDMS print mold is also limited.

Therefore, it is the main subject for the present invention to simplify the solar cell manufacturing process and overcome the problem of dissolving solvents and using the PDMS print mold.

SUMMARY OF THE INVENTION

In view of the aforementioned problem, the present invention provides a manufacturing method for organic optoelectronic thin film, and the manufacturing method adds PEG into a semiconductor layer, and the semiconductor layer is transferred to a conductive polymer layer to solve the problems of the conventional solution manufacturing process that the solvents are dissolved by using the PDMS print mold of the micro-contact printing technology.

Therefore, it is a primary objective of the present invention to overcome the aforementioned shortcomings of the prior art by providing a manufacturing method for an organic optoelectronic thin film, and the manufacturing method comprises the steps of: providing a substrate and a first electrode; forming a semiconductor layer on the substrate, and the semiconductor layer including a polyethylene glycol; coating a conductive polymer layer on the first electrode; placing the substrate and the semiconductor layer on the conductive polymer layer, and attaching the semiconductor layer with the conductive polymer layer; removing the substrate; and evaporating a second electrode on the semiconductor layer to form the organic optoelectronic thin film; wherein a first adhesion is generated between the semiconductor layer and the substrate, and a second adhesion is generated between the semiconductor layer and the conductive polymer layer, and the second adhesion is greater than the first adhesion, such that when the substrate is removed, the semiconductor layer is still attached onto the conductive polymer layer.

In summation, the manufacturing method for an organic optoelectronic thin film in accordance with the present invention has one or more of the following advantages:

(1) The invention simplifies the manufacturing process, and saves the trouble of manufacturing the PDMS print mold to achieve the same transfer effect.

(2) The invention uses a roll-to-roll manufacturing process to coat the solution onto the flexible substrate quickly and easily, so as to further simplify the manufacturing process and reduce the manufacturing time for an easier entry of a mass production.

BRIEF DESCRIPTION OF THE DRAWINGS

FIGS. 2A~2F show a procedure of a manufacturing method of a solar cell in accordance with a preferred embodiment of the present invention;

DETAILED DESCRIPTION OF THE PREFERRED EMBODIMENTS

The foregoing and other objectives, characteristics and advantages of the present invention will become apparent by the detailed description of a preferred embodiment as follows.

Figure 1A:
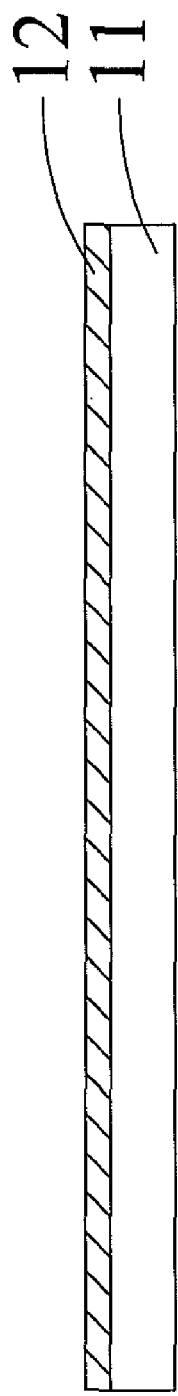
FIGS. 1A~1D show a procedure of a micro-contact printing technology.
Figure 1B:
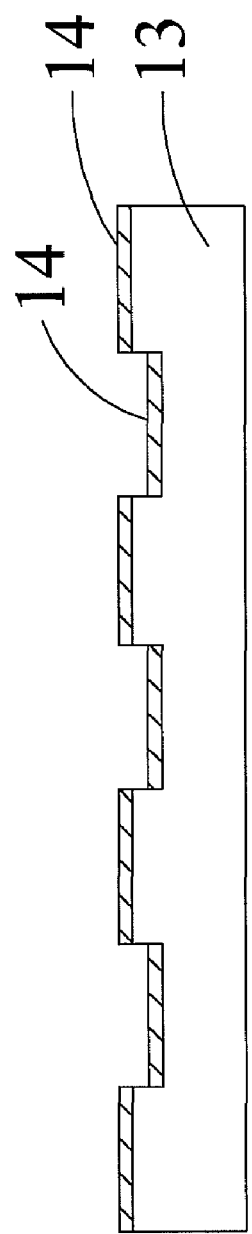
Figure 1C:
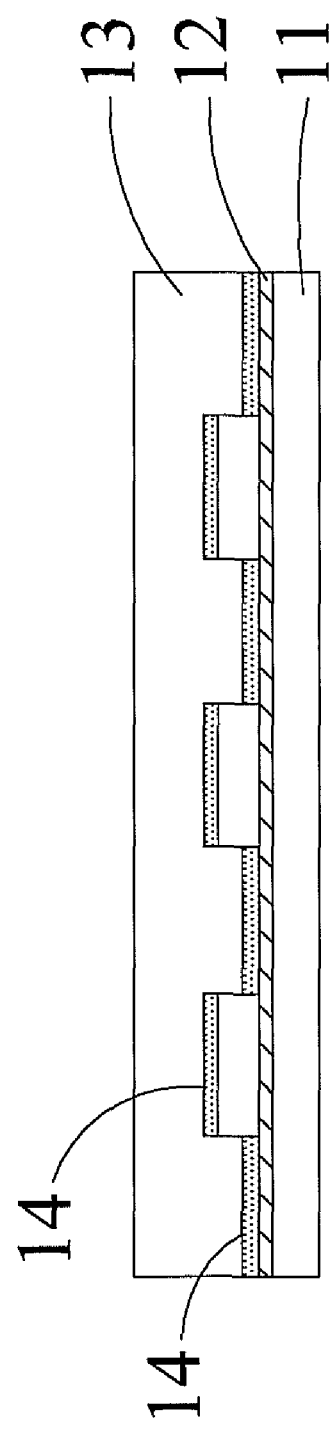
Figure 1D:
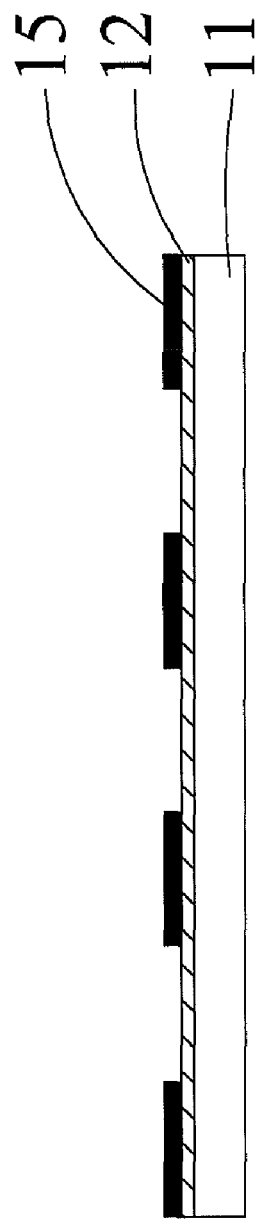
Figure 2A:
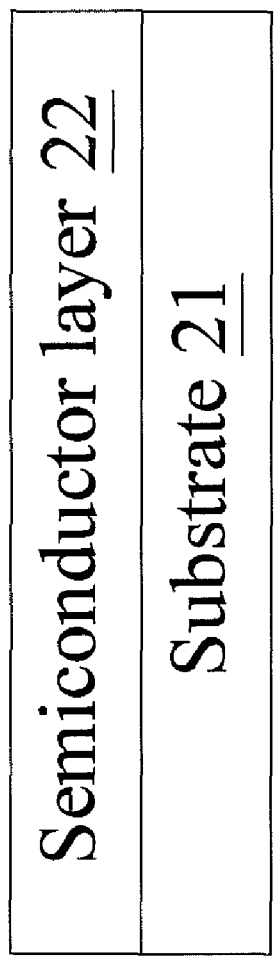

With reference to FIGS. 2A~2F for the procedure of a manufacturing method of a solar cell 2 in accordance with a preferred embodiment of the present invention, the manufacture of the solar cell 2 as shown in FIG. 2A firstly provides a substrate 21. The substrate 21 is one selected from the group consisting of a glass substrate, a polymer plastic substrate and an electronic circuit substrate, and the electronic circuit substrate is a silicon substrate. The polymer plastic substrate is made of a material selected from the group consisting of polyethylene teraphthalate (PET) and polycarbonate. In this preferred embodiment, the substrate 21 is, for example, the silicon substrate.

Secondly, a p-type semiconductor material and an n-type semiconductor material are used for producing a solution, and a poly(ethylene glycol) (PEG) of different molecular weights is added into the solution.

Finally, the substrate 21 is rinsed, and a spin-coating or deposition method is used for forming the solution onto the substrate 21 to form a semiconductor layer 22.

The p-type semiconductor material is one selected from the group consisting of polythiophene, polyfluorene, polyphenylenevinylene, polythiophene derivative, polyfluorene derivative, polyphenylenevinylene derivative, conjugated oligomer and small molecule, and the polythiophene derivative is poly(3-hexylthiophene) (P3HT); the polyfluorene derivative is poly(dioctylfluorene); the polyphenylenevinylene derivative is poly[2-methoxy-5-(2-ethyl-hexyloxy)-1,4-phenylene vinylene]; the conjugated oligomer is sexithiophene, and the small molecule is one selected from the group consisting of pentacene, tetracene, hexabenzcoronene, phthalocyanine, porphyrines, pentacene derivative, tetracene derivative, hexabenzcoronene derivative, phthalocyanine derivative, and porphyrin compound derivative.

The n-type semiconductor material is one selected from the group consisting of C60, C60 derivative, C70, C70 derivative, carbon nanotube, carbon nanotube derivative, 3,4,9,10-perylene tetracarboxylic-bis-benzimidazole (PTCBI), N,N'-dimethyl-3,4,9,10-perylenetetracarboxylic acid diimide (Me-PTCDI), 3,4,9,10-perylene tetracarboxylic-bis-benzimidazole (PTCBI) derivative, N,N'-dimethyl-3,4,9,10-tetracarboxylic acid dimide derivative, polymer and semiconductor nanoparticle; the C60 derivative is phenyl C61-butyric acid methyl ester (PCBM); the polymer is one selected from the group consisting of poly(2,5,2',5'-tetrahexyloxy-7,8'-dicyano-di-p-phenylenevinylene) (CN-PPV) and poly(9,9'-dioctylfluorene-co-benzothiadiazole) (F8BT); the carbon nanotube is a multi-walled carbon nanotube or a single-walled carbon nanotube, and the cross-sectional diameter of the carbon nanotube is smaller than 100 nm; and the semiconductor nanoparticle is one selected from the group consisting of titanium dioxide, cadmium selenide and cadmium sulfide.

In this preferred embodiment, the p-type semiconductor material is preferably P3HT, and the n-type semiconductor material is preferably PCBM, and the ratio by weight of P3HT and PCBM is 1:1, and they are mixed into a solution with a percentage by weight of 2%. In the meantime, the PEG of different molecular weights and P3HT have a specific ratio by weight. For example, the weight ratio of PEG and P3HT is 1:5~1:5, and preferably 1:20.

After the semiconductor layer 22 is processed by a solvent annealing process for at least 2 hours, the semiconductor layer 22 is processed by a thermal annealing process at 110° C. for 15 minutes.

Figure 2B:
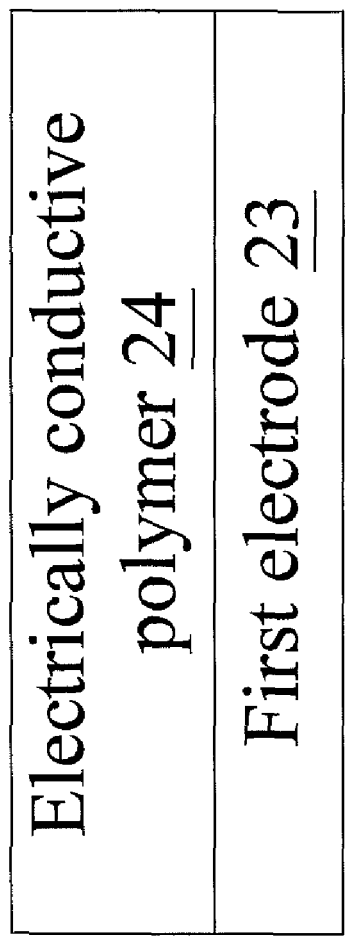

In FIG. 2B, a patterned first electrode 23 is provided, and the first electrode 23 is a transparent conductor or a semi-transparent conductor; the transparent conductor is made of indium tin oxide (ITO) or indium zinc oxide; the semi-transparent conductor is a metal thin film, and the metal thin film is made of a material selected from the group consisting of silver, aluminum, titanium, nickel, copper, gold, and chromium.

After the first electrode 23 is rinsed, a conductive polymer layer 24 is coated onto the first electrode 23 by a spin-coating process, and then the conductive polymer layer 24 and the first electrode 23 are baked dry at 120° C. for 60 minutes.

The electrically conductive polymer of the conductive polymer layer 24 is made of a material selected from the group consisting of 3,4-polyethylenedioxythiophene-polystyrenesulfonate (PEDOT:PSS), polyaniline, polypyrrole and polyacetylene. The additive is a surfactant, and the surfactant is poly(oxyethylene tridecyl ether). In this preferred embodiment, the conductive polymer layer 24 is preferably made of PEDOT: PSS.

Figure 2C:
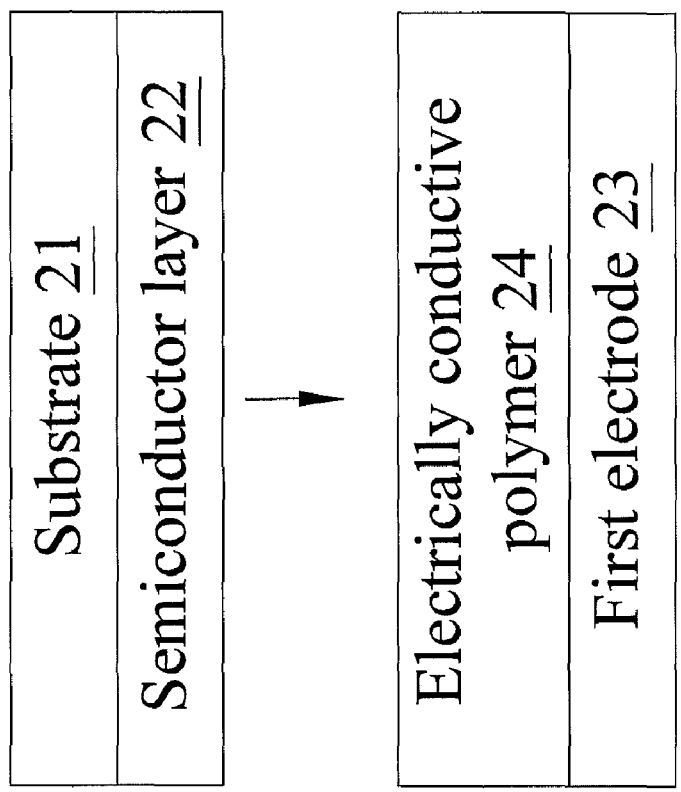

In FIG. 2C, a transfer procedure takes place. Before the transfer, the conductive polymer layer 24 is heated at 110° C. for 5 minutes, and then the substrate 21 and the semiconductor layer 22 are placed on the conductive polymer layer 24, and the semiconductor layer 22 is attached with the conductive polymer layer 24. After the attachment, a uniform pressure is exerted onto a junction of the semiconductor layer 22 and the conductive polymer layer 24 as shown in FIG. 2D. A first adhesion is generated between the semiconductor layer 22 containing PEG of different molecular weights and the substrate 21 and a second adhesion is generated between the semiconductor layer 22 containing PEG of different molecular weights and the conductive polymer layer 24.

Since the PEG is deposited at a position near the substrate 21 or the PEG is distributed on the contact surface with the substrate 21, therefore the adhesion between the semiconductor layer 22 and the substrate 21 is weaker than the adhesion between the semiconductor layer 22 and the conductive polymer layer 24. In other words, the strength of the second adhesion is greater than the strength of the first adhesion. The weaker adhesion between the semiconductor layer 22 and the substrate 21 causes a weaker binding.

Figure 2E:
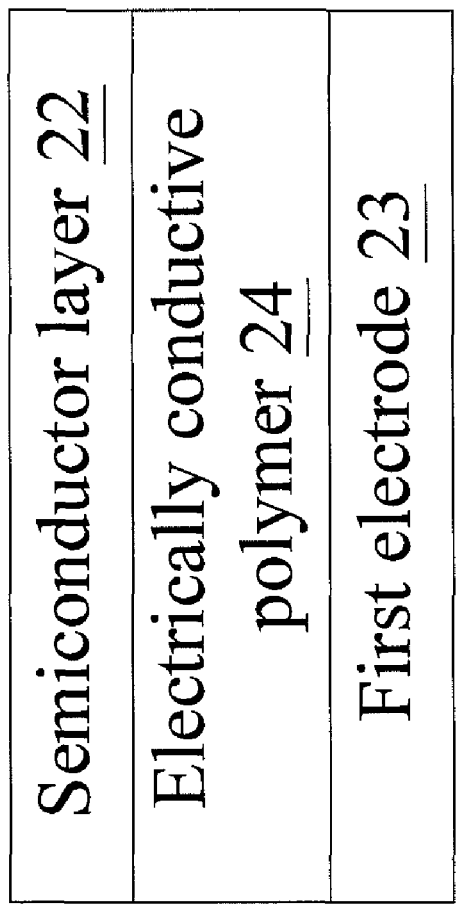

Then, the substrate 21 is removed. Since the first adhesion is smaller than the second adhesion, therefore the semiconductor layer 22 will still be attached onto the conductive polymer layer 24 as shown in FIG. 2E to complete the transfer.

Figure 2F:
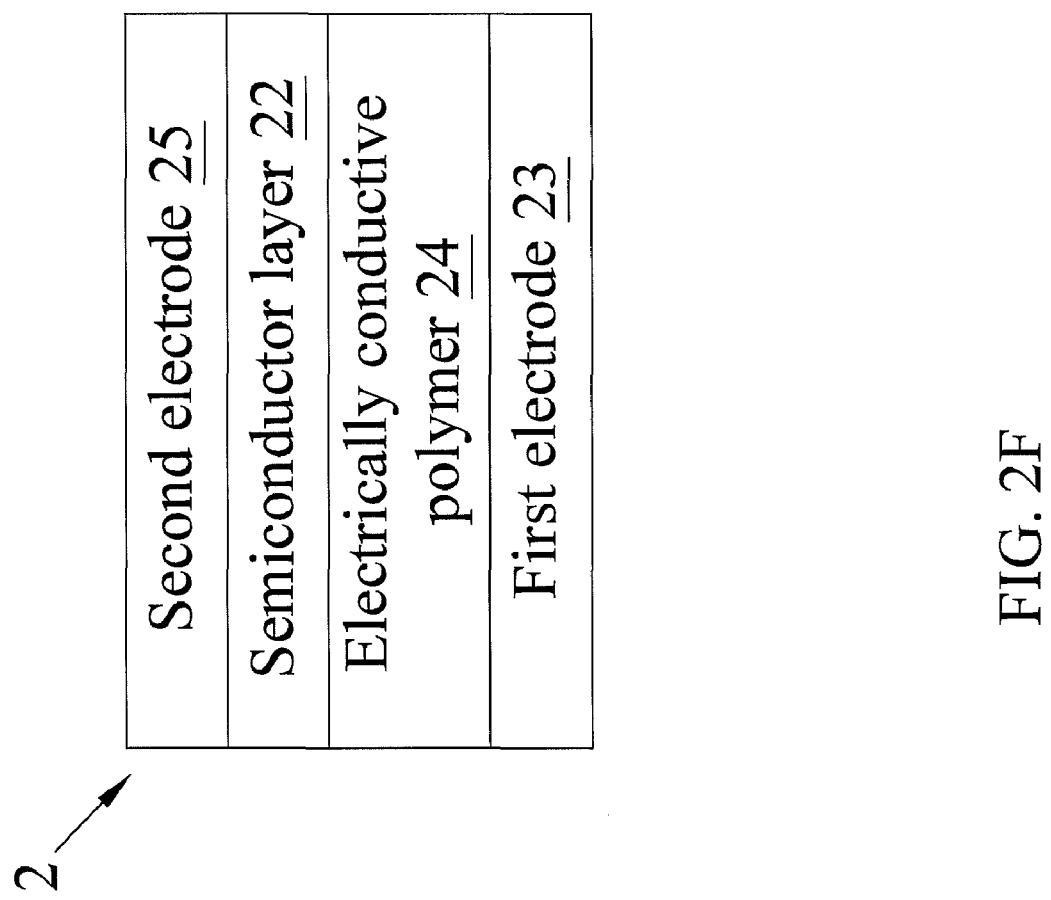

In FIG. 2F, after the semiconductor layer 22 is transferred, a thermal evaporation method is used to evaporate a second electrode 25 onto the semiconductor layer 22 to complete manufacturing of the solar cell 2.

The second electrode 25 is a single-layer structure or a double-layer structure, and the single-layer structure is made of magnesium-gold alloy, and the double-layer structure is made of lithium/aluminum or calcium/aluminum.

Figure 3:
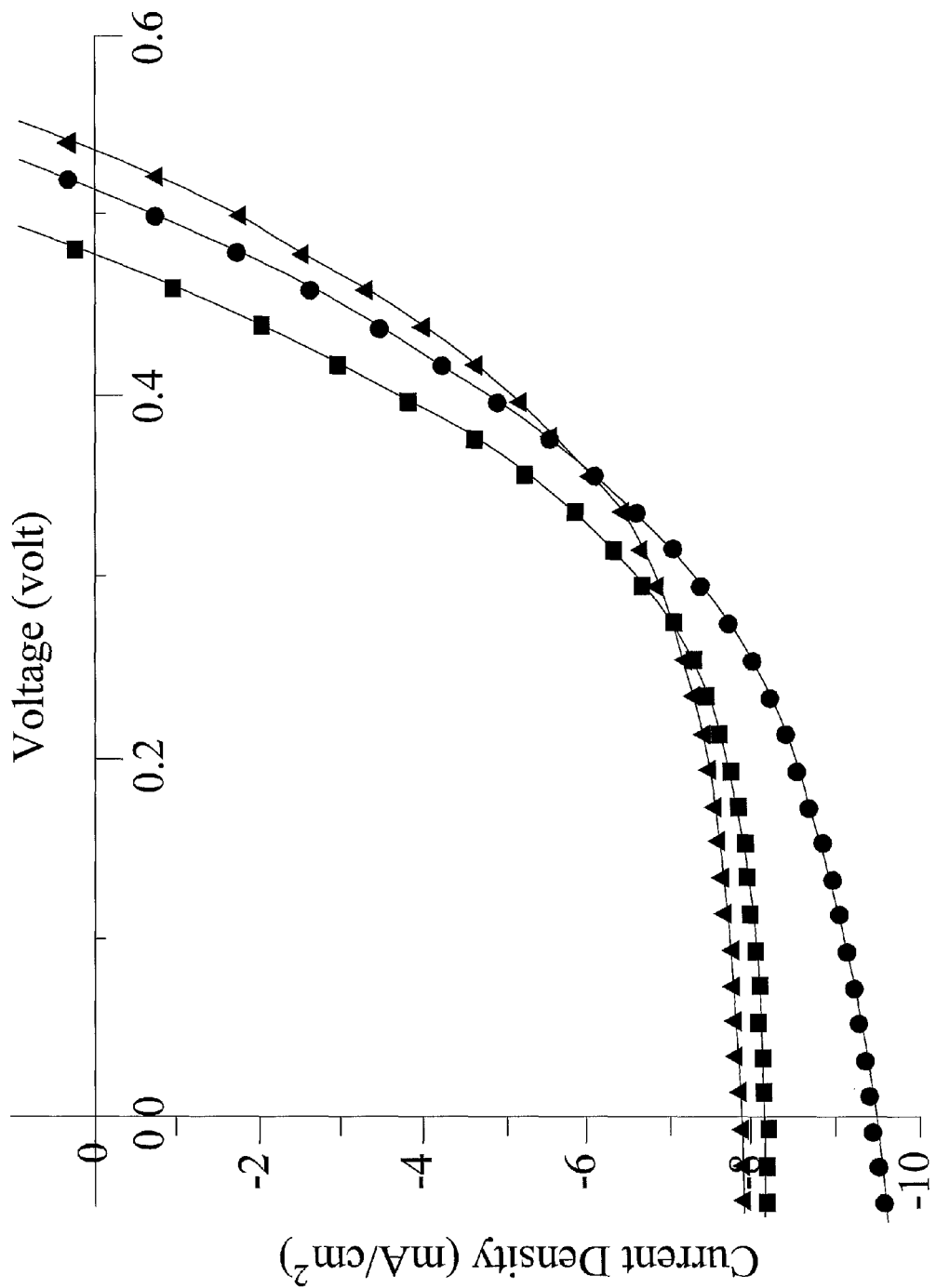
FIG. 3 is a graph of voltage versus current density of a solar cell manufacturing by a transfer method and a coating method of the semiconductor layer containing PEG and a coating method of a semiconductor layer of a solar cell without containing any PEG at 100 mW/cm$^2$ and with a standard solar energy simulated light of AM 1.5 G.

With reference to FIG. 3 for a graph of voltage versus current density of a solar cell manufacturing by a transfer method and a spin-coating method of the semiconductor layer containing PEG and a coating method of a semiconductor layer of a solar cell without containing any PEG at 100 mW/cm$^2$ and with a standard solar energy simulated light of AM 1.5 G, the characteristics of solar cells manufactured by using the transfer method and using the spin-coating method are similar, and it shows that the method of the present invention can be used for manufacturing the solar cells successfully by the transfer method.

In addition, Table 1 shows the parameters of the solar cells manufactured by using a semiconductor layer containing PEG and a transfer method of (PEG600 (5%) (Transfer)), a spin-coating method of (PEG600 (5%) (Spin)), and using a semiconductor layer containing no PEG by a spin coating method of (P3HT and PCBM (Spin)).

Parameters of each component of the solar cell are defined first. With infinite load resistance of the solar cell, the voltage is called open circuit voltage (VOC) when the external current is disconnected (or the current is equal to zero). When the voltage is zero, the current density is called short circuit current density (JSC). In the graph of the current density versus the voltage of the solar cell, the output power (P) at any working point is equal to the product (P=V×J) of the corresponding voltage (V) and current density (J) of the working point, wherein one of the working points (Vm, Jm) has the maximum output power (Pm, Pm=Vm×Jm). The ratio of the maximum output power and the product of the open circuit voltage and the short circuit current density is defined as a filling factor (FF) and FF=(Vm×Jm)/(VOC×J SC)).

For solar cells with better component properties, the filling factor should be close to 1, in addition to the required high open circuit voltage and short circuit current density. The filling factor represents level of the maximum output power approaching the product of the open circuit voltage and close circuit current density. The power conversion efficiency (η=(V OC×J SC×FF)/P in) of the solar cell is defined as the ratio of the output power and the input light energy (P in), such that when the filling factor value is approaching to 1, the power conversion efficiency becomes increasingly higher.

TABLE 1

| | Open circuit voltage VOC (V) | Short circuit current density Jsc (mA/cm$^2$) | Power conversion efficiency η(%) | Filling Factor (FF) |
|---|---|---|---|---|
| P3HT and PCBM (SPIN) | 0.47 | 8.21 | 2.02 | 0.52 |
| PEG600 (5%)(SPIN) | 0.51 | 9.47 | 2.25 | 0.47 |
| PEG600 (5%) (TRANSFER) | 0.53 | 7.86 | 2.16 | 0.52 |

From Table 1, the solar cell with the semiconductor layer containing no PEG has an open circuit voltage of 0.47V, a power conversion efficiency of 2.02%, and the solar cell with the semiconductor layer containing PEG and manufactured by the spin-coating method has an open circuit voltage increased to 0.51V, and a power conversion efficiency increased to 2.25%, and the solar cell with the semiconductor layer containing PEG and manufactured by the transfer method has an open-circuit voltage increased to 0.53V and a power conversion efficiency increased to 2.16%. Table 1 shows that the solar cell with the semiconductor layer containing PEG has a better function and effect than the solar cell with the semiconductor layer containing no PED, regardless of its manufacture by the spin-coating manufacturing process or the transfer manufacturing process.

Figure 4:
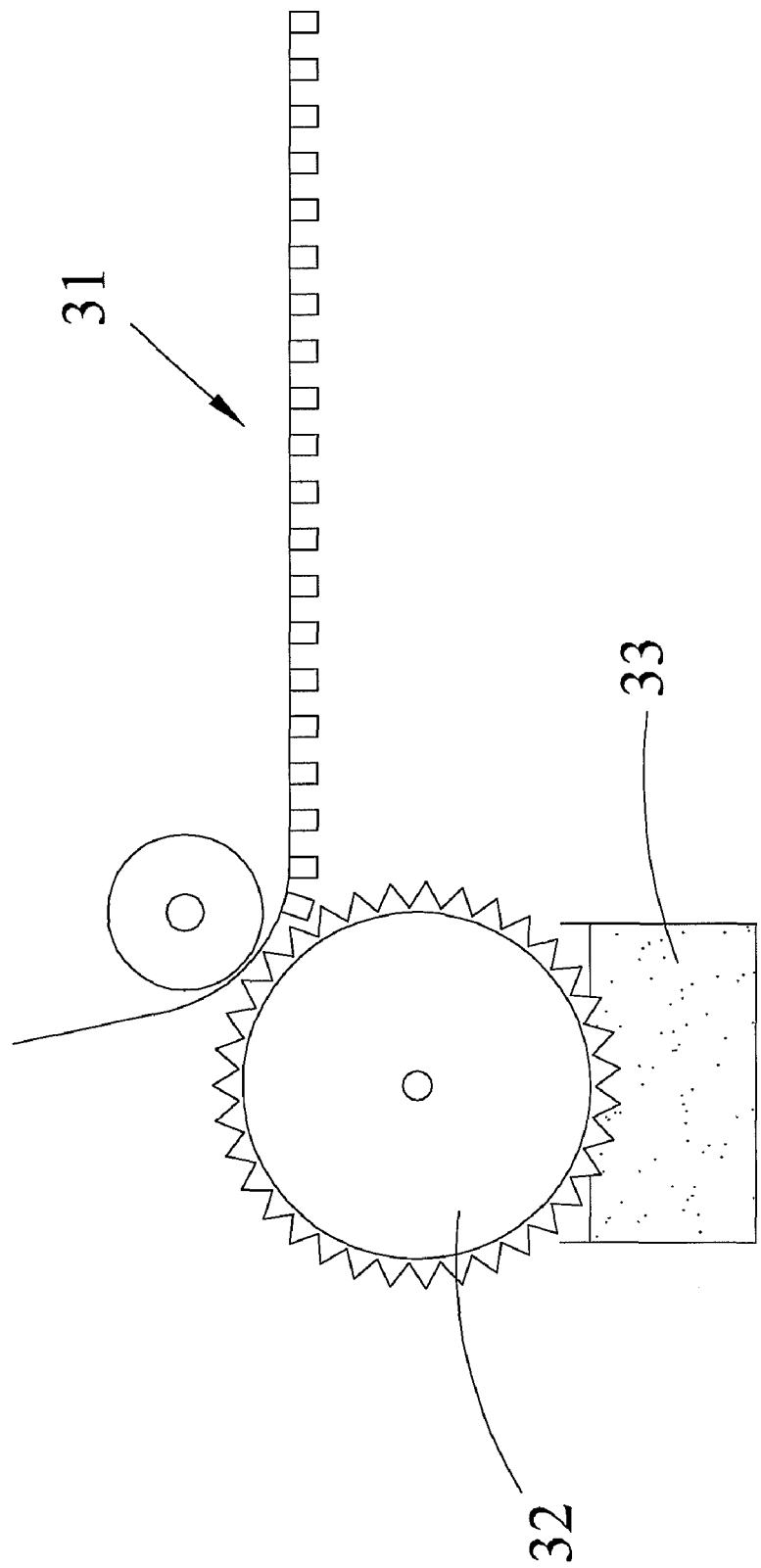
FIG. 4 is a schematic view of a roll-to-roll manufacturing process of a solar cell in accordance with the present invention.

With reference to FIG. 4 for a schematic view of a roll-to-roll manufacturing process of a solar cell in accordance with the present invention, the roll-to-roll manufacturing process replaces the process of coating a solution onto the substrate as shown in FIG. 2A.

In FIG. 4, the roll-to-roll manufacturing process includes at least one roller 32 and a flexible substrate 31, and further includes a solution 33 made by a p-type semiconductor material, an n-type semiconductor material and PEG. The surface of the roller 32 is made of a material similar to silicon dioxide, and with an appropriate pattern. When the surface of the roller 32 is rotating, the surface of the roller 32 is in contact with the solution 33, such that the solution 33 is coated onto the flexible substrate 31.

The roll-to-roll manufacturing process makes use of the characteristic of the weaker contact force between the organic material and the surface of the roller, the solution can be coated quickly and easily onto the flexible substrate, so as to simplify the manufacturing process and reduce the manufacturing time for an easier entry of a mass production.

The manufacturing method for an organic optoelectronic thin film in accordance with the present invention is not limited for the use of manufacturing solar cells only, but it can also be applied for manufacturing light emitting diodes, thin film transistors and flexible solar cells and modules.

The manufacturing method for an organic optoelectronic thin film in accordance with the present invention can achieve the effects of simplifying the manufacturing process and saving the trouble of manufacturing the PDMS print mold to achieve the same transfer effect.

What is claimed is:

1. A manufacturing method for an organic optoelectronic thin film, comprising the steps of:
providing a substrate and a first electrode;
forming a semiconductor layer on the substrate, and the semiconductor layer including a polyethylene glycol;
forming a conductive polymer layer on the first electrode;
placing the substrate and the semiconductor layer on the conductive polymer layer, and attaching the semiconductor layer with the conductive polymer layer;
removing the substrate; and
forming a second electrode on the semiconductor layer to produce the organic optoelectronic thin film;
wherein a first adhesion is generated between the semiconductor layer and the substrate, and a second adhesion is generated between the semiconductor layer and the conductive polymer layer, and the second adhesion is greater than the first adhesion, such that when the substrate is removed, the semiconductor layer is still attached onto the conductive polymer layer.

2. The manufacturing method for an organic optoelectronic thin film as recited in claim 1, wherein the polyethylene glycol is distributed on a contact surface of the semiconductor layer and the substrate in the step of placing the substrate and the semiconductor layer on the conductive polymer layer.

3. The manufacturing method for an organic optoelectronic thin film as recited in claim 1, wherein the semiconductor layer is made of a combination of a p-type semiconductor material, an n-type semiconductor material and the polyethylene glycol, and the p-type semiconductor layer is poly(3-hexylthiophene) (P3HT), and the n-type semiconductor layer is PCBM, and the ratio by weight of P3HT and phenyl C61-butyric acid methyl ester (PCBM) is 1:1.

4. The manufacturing method for an organic optoelectronic thin film as recited in claim 3, wherein the ratio by weight of polyethylene glycol and P3HT is 1:5~1:5.

5. The manufacturing method for an organic optoelectronic thin film as recited in claim 1, further comprising the step of performing a solvent annealing of the semiconductor layer for at least two hours, after the step of forming the semiconductor layer on the substrate.

6. The manufacturing method for an organic optoelectronic thin film as recited in claim 1, further comprising the step of uniformly applying a pressure to the semiconductor layer and the conductive polymer layer after the step of attaching the semiconductor layer with the conductive polymer layer, such that the semiconductor layer is attached closely to the conductive polymer layer.

7. The manufacturing method for an organic optoelectronic thin film as recited in claim 1, wherein the step of forming the semiconductor layer on the substrate is to form the semiconductor layer on the substrate by a roll-to-roll manufacturing process.

8. The manufacturing method for an organic optoelectronic thin film as recited in claim 1, wherein the organic optoelectronic thin film is one selected from the group consisting of a solar cell, a flexible solar cell and module, a light emitting diode and a thin film transistor.

* * * * *